(12) United States Patent
Bhugra et al.

(10) Patent No.: US 7,955,885 B1
(45) Date of Patent: Jun. 7, 2011

(54) METHODS OF FORMING PACKAGED MICRO-ELECTROMECHANICAL DEVICES

(75) Inventors: Harmeet Bhugra, San Jose, CA (US); Kuolung Lei, San Jose, CA (US); Ye Wang, Cupertino, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 147 days.

(21) Appl. No.: 12/351,020

(22) Filed: Jan. 9, 2009

(51) Int. Cl.
*H01L 21/00* (2006.01)
*H01L 21/30* (2006.01)
*H01L 21/46* (2006.01)

(52) U.S. Cl. ............ 438/51; 438/52; 438/121; 438/455; 438/456; 438/460; 257/E21.499; 257/E21.532; 257/E21.705

(58) Field of Classification Search ........... 257/E21.499, 257/E21.532, E21.705
See application file for complete search history.

(56) References Cited

U.S. PATENT DOCUMENTS

| | | | |
|---|---|---|---|
| 6,559,530 B2 * | 5/2003 | Hinzel et al. ............... 257/684 |
| 6,759,590 B2 | 7/2004 | Stark | |
| 6,770,503 B1 * | 8/2004 | Marinis et al. ............... 438/48 |
| 6,872,902 B2 | 3/2005 | Cohn et al. | |
| 6,953,985 B2 | 10/2005 | Lin et al. | |
| 6,962,834 B2 | 11/2005 | Stark | |
| 7,026,223 B2 | 4/2006 | Goodrich et al. | |
| 7,109,580 B2 | 9/2006 | Heschel et al. | |
| 7,184,202 B2 | 2/2007 | Miles et al. | |
| 7,226,810 B2 | 6/2007 | Kocian et al. | |
| 7,288,464 B2 | 10/2007 | Haluzak et al. | |
| 7,291,513 B2 | 11/2007 | Quellet et al. | |
| 7,358,106 B2 | 4/2008 | Potter | |
| 7,388,285 B2 | 6/2008 | Heschel et al. | |
| 7,396,478 B2 | 7/2008 | Hayworth et al. | |
| 7,402,905 B2 | 7/2008 | Eskridge et al. | |
| 7,419,853 B2 | 9/2008 | Kuhmann et al. | |
| 7,429,784 B2 | 9/2008 | Huang | |
| 7,466,018 B2 | 12/2008 | Kocian et al. | |
| 7,485,956 B2 | 2/2009 | Tuckerman et al. | |
| 7,491,567 B2 | 2/2009 | DCamp et al. | |
| 7,495,462 B2 | 2/2009 | Hua et al. | |
| 7,517,712 B2 | 4/2009 | Stark | |
| 7,518,775 B2 | 4/2009 | Miles et al. | |
| 7,528,691 B2 * | 5/2009 | Wallis et al. ............... 335/78 |
| 7,576,426 B2 | 8/2009 | Gan et al. | |
| 7,629,201 B2 | 12/2009 | Gan et al. | |
| 7,659,150 B1 | 2/2010 | Monadgemi et al. | |
| 7,732,902 B2 | 6/2010 | McKinnell et al. | |
| 7,736,929 B1 | 6/2010 | Monadgemi et al. | |
| 7,736,946 B2 | 6/2010 | Seppala et al. | |
| 2004/0099921 A1 * | 5/2004 | Brady ............... 257/452 |
| 2006/0194361 A1 | 8/2006 | Heck et al. | |
| 2006/0197215 A1 | 9/2006 | Potter | |
| 2006/0273430 A1 | 12/2006 | Hua et al. | |
| 2007/0099395 A1 * | 5/2007 | Sridhar et al. ............... 438/460 |

(Continued)

*Primary Examiner* — Savitri Mulpuri
*Assistant Examiner* — Mohsen Ahmadi
(74) *Attorney, Agent, or Firm* — Myers Bigel, et al.

(57) ABSTRACT

Methods of forming packaged micro-electromechanical devices include forming a first substrate having a micro-electromechanical device therein, which extends adjacent a first surface of the first substrate. A first surface of a second substrate is then bonded to the first surface of the first substrate, to thereby encapsulate the micro-electromechanical device within a space provided between the first and second substrates. Subsequent to bonding, a second surface of the second substrate is selectively etched to define at least one through-substrate opening therein, which exposes an electrode of the micro-electromechanical device. Thereafter, the through-substrate opening is filled with an electrically conductive through-substrate via.

7 Claims, 6 Drawing Sheets

U.S. PATENT DOCUMENTS

| | | |
|---|---|---|
| 2007/0128828 A1 | 6/2007 | Chen et al. |
| 2007/0228540 A1 | 10/2007 | Kocian et al. |
| 2009/0029500 A1 * | 1/2009 | Wan .................................. 438/51 |
| 2009/0194829 A1 | 8/2009 | Chung et al. |

* cited by examiner

METHODS OF FORMING PACKAGED MICRO-ELECTROMECHANICAL DEVICES

FIELD OF THE INVENTION

The present invention relates to methods of packaging microelectronic devices and, more particularly, to methods of fabricating microelectronic circuit substrates used in packaging.

BACKGROUND OF THE INVENTION

Microelectronic circuits formed in integrated circuit chips are typically passivated using electrically insulating layers that are formed on the chips during back-end processing steps. These back-end processing steps may also include packaging the chips into a packaged integrated circuit device that protects the one or more chips from chemical contamination, thermal stresses, electrical and magnetic interference and other environmental influences. Notwithstanding these conventional techniques, there continues to be a need for improved packaging options for microelectronic circuits that may contain state-of-the-art devices, such as micro-electromechanical (MEMs) devices that can be more susceptible to contamination and other environmental influences.

SUMMARY OF THE INVENTION

Methods of forming packaged micro-electromechanical devices according to some embodiments of the invention include forming a first substrate having a micro-electromechanical device therein, which extends adjacent a first surface of the first substrate. A first surface of a second substrate is then bonded to the first surface of the first substrate, to thereby encapsulate the micro-electromechanical device within a space provided between the first and second substrates. Subsequent to bonding, a second surface of the second substrate is selectively etched to define at least one through-substrate opening therein, which exposes an electrode of the micro-electromechanical device. Thereafter, the through-substrate opening is filled with an electrically conductive through-substrate via.

According to additional embodiments of the invention, the filling of the through-substrate opening includes forming a seal ring that surrounds the micro-electromechanical device, on the first surface of the first substrate. In particular, the seal ring may define a ring-shaped flange that surrounds at least a portion of the second substrate. This ring-shaped flange may extend onto the second surface of the second substrate. The through-substrate via may be formed as a metal via and the seal ring may be formed as metal seal ring that hermetically seals the first and second substrates together.

According to further embodiments of the invention, the step of bonding a first surface of a second substrate to the first surface of the first substrate is preceded by a step of forming a polymer layer on the first surface of the second substrate. Then, during bonding, at least a first portion of the polymer layer is bonded to at least a portion (e.g., electrode) of the micro-electromechanical device.

Methods of forming packaged micro-electromechanical devices according to additional embodiments of the invention include forming a first substrate having a micro-electromechanical device therein adjacent a first surface thereof and bonding a first surface of a second substrate to the first surface of the first substrate. An electrically conductive metal layer is then deposited on the second surface of the second substrate and on the first surface of the first substrate. The electrically conductive metal layer is then patterned to define a seal ring that hermetically seals the first and second substrates together. The step of depositing the electrically conductive metal layer may be preceded by a step of selectively etching the second surface of the second substrate for a sufficient duration to define a through-substrate opening therein, which may expose an electrode of the micro-electromechanical device. This opening exposes a portion of the micro-electromechanical device. This opening may be filled with the electrically conductive metal layer. These embodiments of the invention may also include thinning the second substrate in advance of selectively etching the second surface of the second substrate.

DESCRIPTION OF PREFERRED EMBODIMENTS

Figure 1:
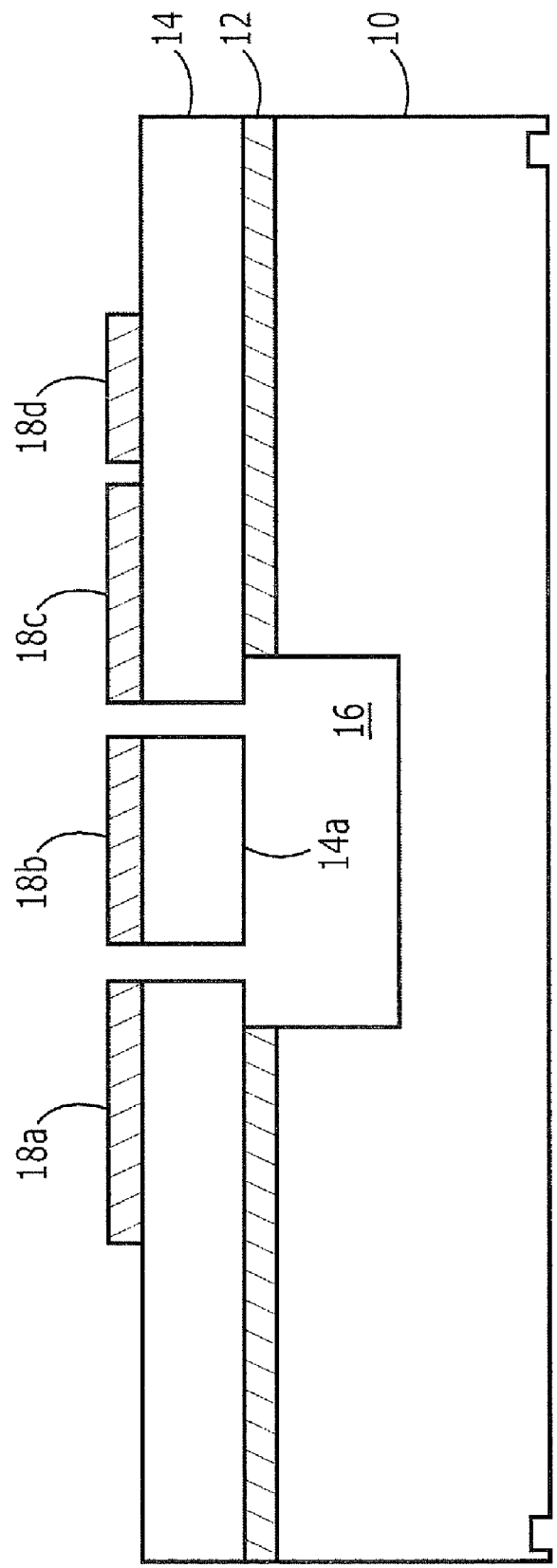
FIGS. 1-6 are cross-sectional views of intermediate structures that illustrate methods of forming packaged micro-electromechanical devices, according to embodiments of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Referring now to FIG. 1, methods of forming packaged micro-electromechanical devices according to some embodiments of the invention include forming a first substrate having a micro-electromechanical device therein, which extends adjacent a first surface of the first substrate. The first substrate is illustrated as including a composite of a first silicon substrate 10 (e.g., single crystal silicon wafer), an electrically insulating layer 12 on the first silicon substrate 10 and a silicon layer 14 on the electrically insulating layer 12. The first silicon substrate 10 and the electrically insulating layer 12 are illustrated as including a recess 16 therein. A micro-electromechanical device is provided adjacent the recess 16. The micro-electromechanical device is illustrated as a resonator containing a resonator body 14a, which is suspended (e.g., by anchors, not shown) above the recess 16. The resonator, which may be a thin-film piezoelectric-on-substrate resonator, is also illustrated as including active regions and electrodes, which are shown collectively by the reference numerals 18a, 18b, 18c and 18d. Alternative micro-electromechanical devices besides resonators may also be provided on the first substrate.

Figure 2:
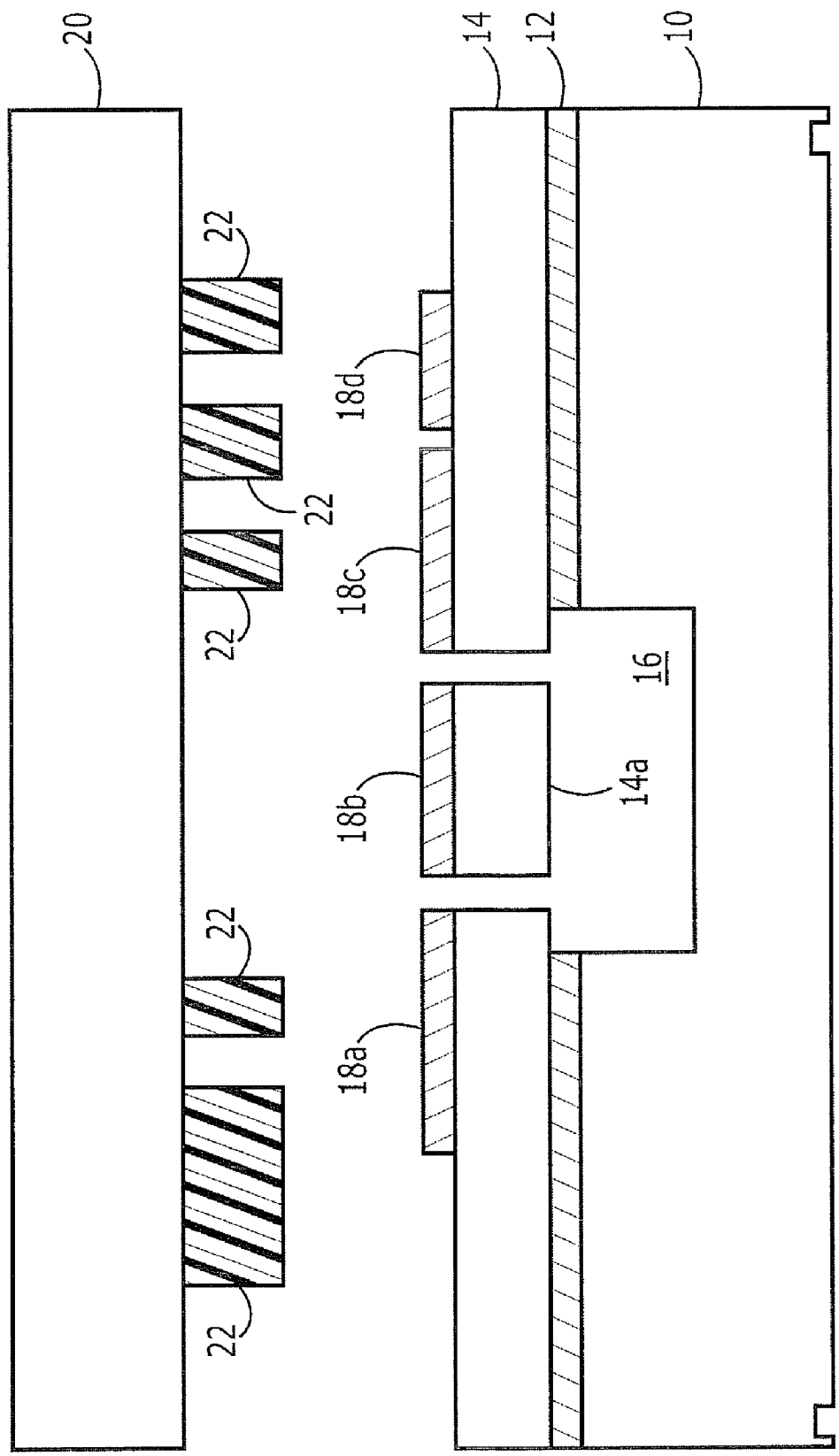
Figure 3:
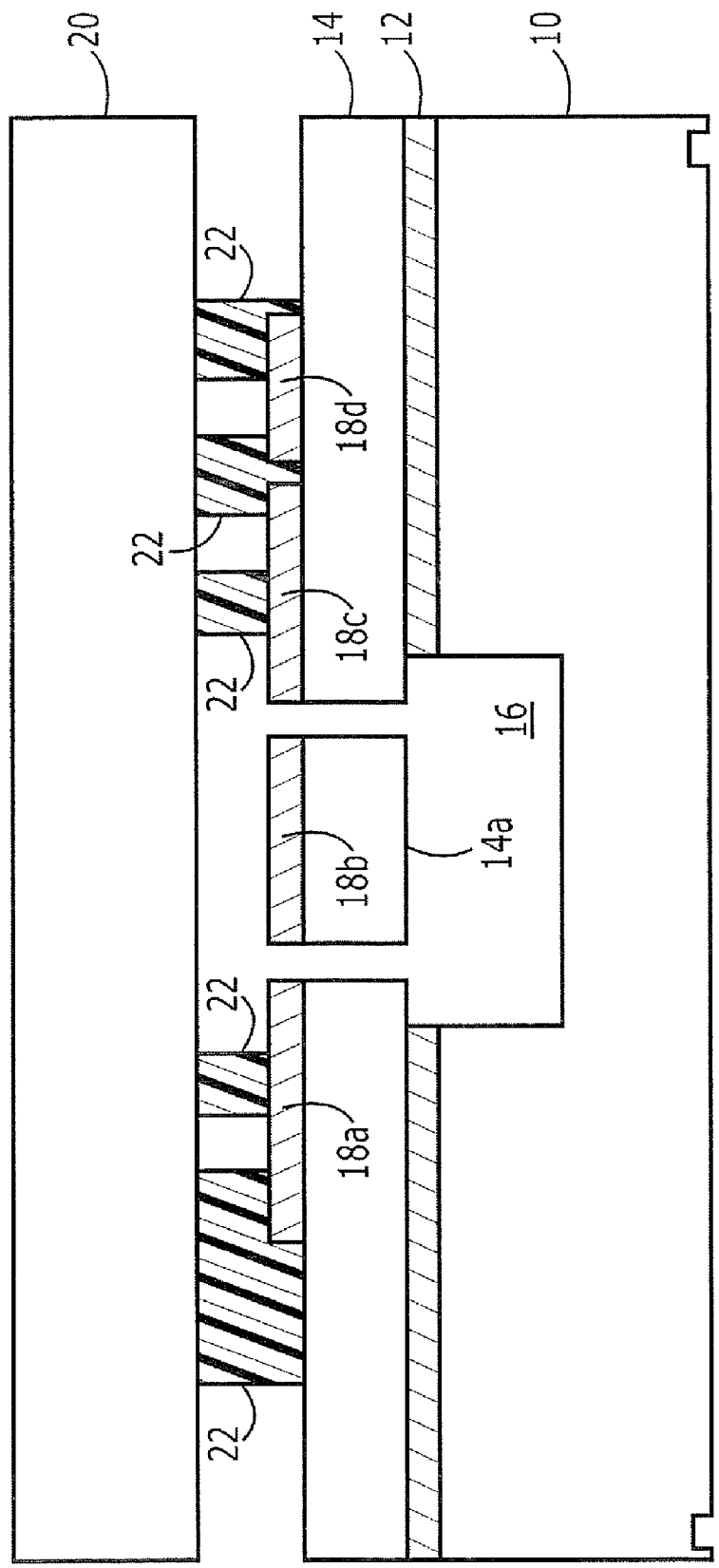
Figure 4:
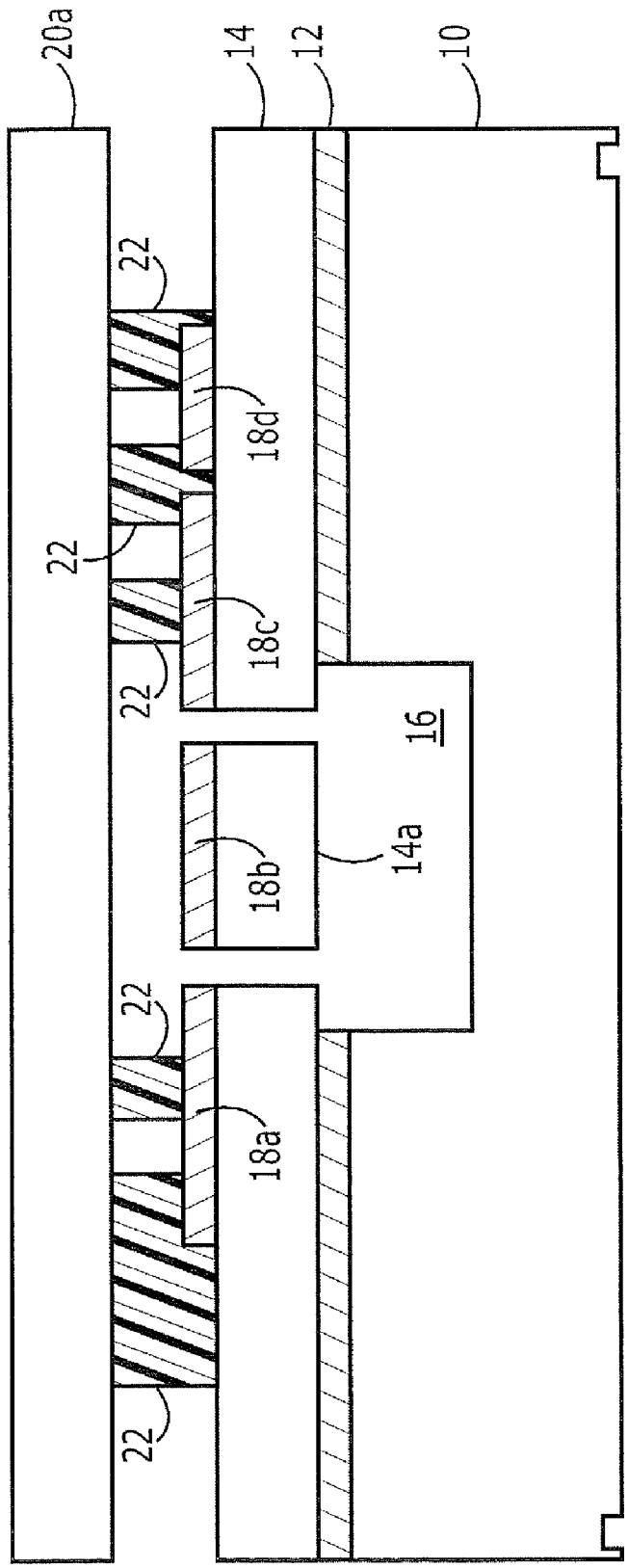
Figure 5:
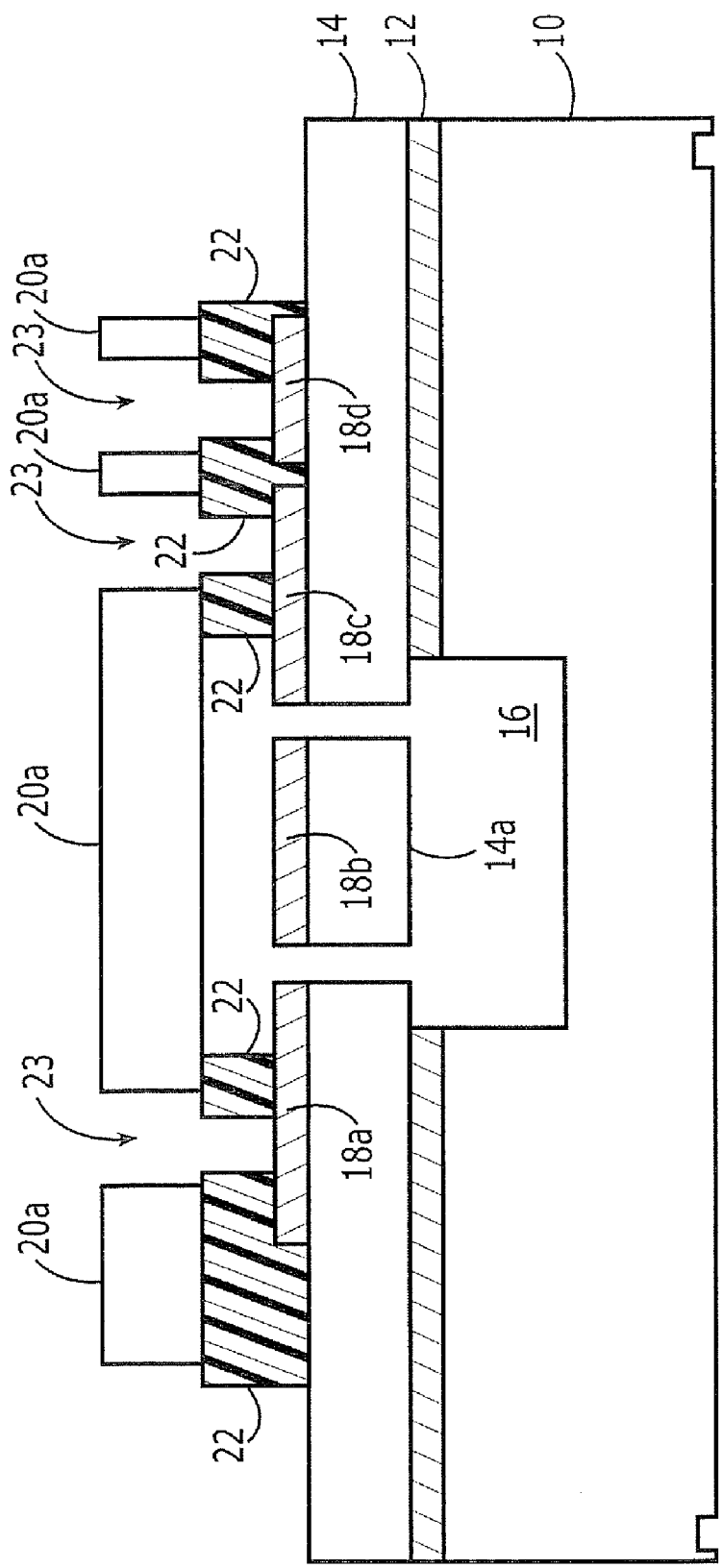

Referring now to FIGS. 2-3, a first surface of a second substrate 20 is then bonded to the first surface of the first substrate (10, 12 and 14), to thereby encapsulate the micro-electromechanical device within a space provided between the first and second substrates. As illustrated, a patterned polymer layer 22, which may be a photo-imagable epoxy (e.g., SU-8) that is formed on the first surface of the second substrate 20, may be used to bond the first and second substrates together. Thereafter, as illustrated by FIG. 4, the second substrate 20 is thinned (e.g., polished) to define a capping substrate 20a. The capping substrate 20a is then selectively etched to define through-substrate openings 23 therein, which expose at least one electrode (e.g., 18*a*, 18*c* and/or 18*d*) of the encapsulated micro-electromechanical device, as illustrated by FIG. 5.

Figure 6:
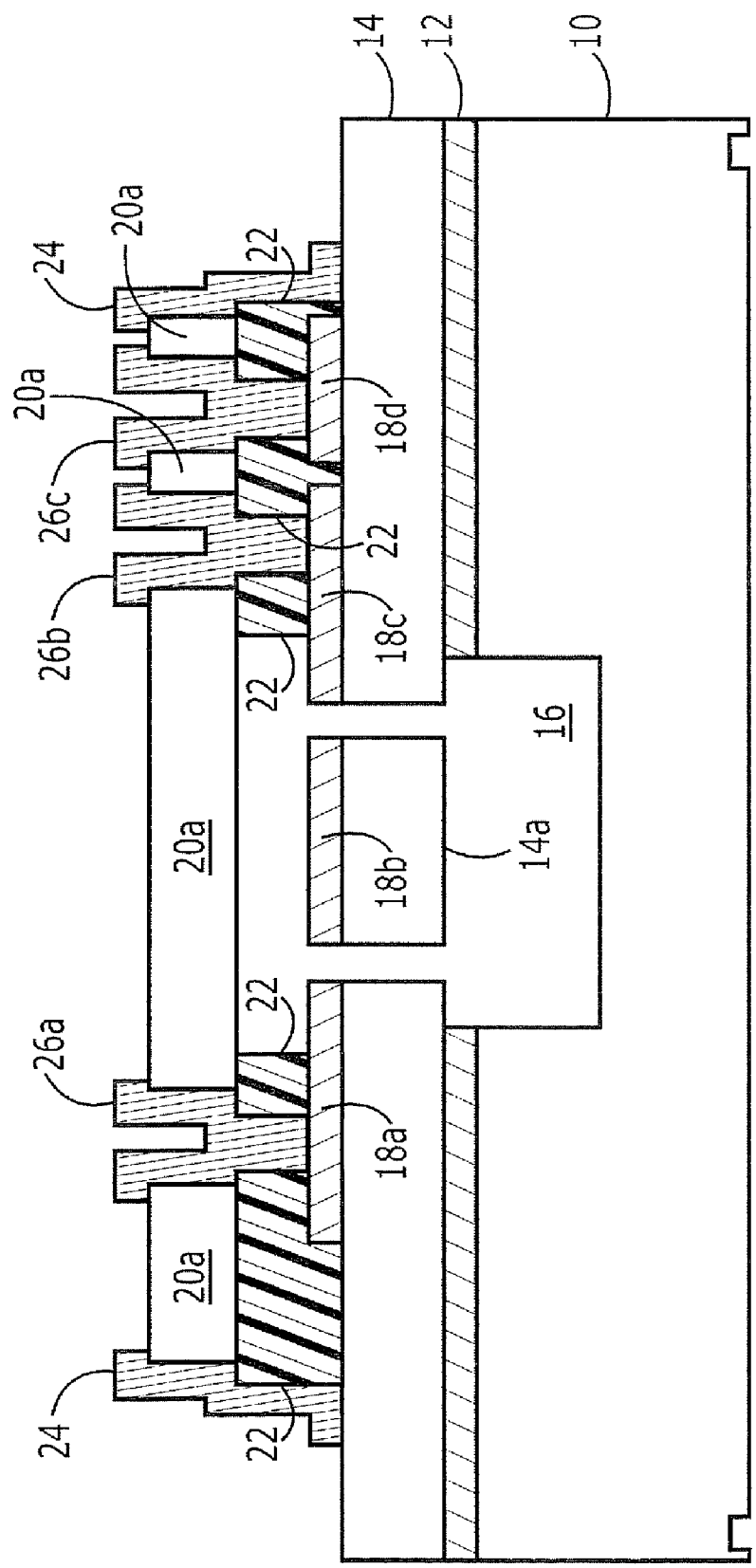

Referring now to FIG. 6, the through-substrate openings 23 are filled with electrically conductive through-substrate vias 26*a*-26*c* and an electrically conductive seal ring 24 that surrounds the micro-electromechanical device and directly contacts an upper surface of the capping substrate 20*a* and the silicon layer 14. The seal ring 24 may define a ring-shaped flange that surrounds at least a portion of the capping substrate 20*a*. The through-substrate vias 26*a*-26*c* may be formed as metal vias and the seal ring 24 may be formed as metal seal ring (e.g., AlCu metal seal ring) that protects the micro-electromechanical device from environmental contamination by hermetically sealing the first substrate to the capping substrate. The metal vias 26*a*-26*c* and the seal ring 24 may be formed by conformally depositing a metal layer (e.g., AlCu layer) onto the intermediate structure of FIG. 5 and then patterning the deposited metal layer using conventional metal patterning techniques.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a packaged micro-electromechanical device, comprising:
    forming a first substrate having a micro-electromechanical device therein adjacent a first surface thereof;
    bonding a first surface of a second substrate to the first surface of the first substrate; then
    selectively etching a second surface of the second substrate for a sufficient duration to define a through-substrate opening therein that exposes an electrode of the micro-electromechanical device; and
    filling the through-substrate opening with an electrically conductive through-substrate via that contacts the exposed electrode concurrently with forming a seal ring that extends on the first and second surfaces of the first and second substrates, respectively, and hermetically seals the first and second substrates together, by conformally depositing a metal layer onto the first and second substrates and then patterning the deposited metal layer into the through-substrate via and the seal ring.

2. The method of claim 1, wherein the metal layer comprises AlCu.

3. The method of claim 1, wherein the seal ring defines a ring-shaped flange that surrounds the second substrate.

4. The method of claim 1, wherein said bonding is preceded by a step of forming a polymer layer on the first surface of the second substrate; and wherein said bonding comprises bonding at least a portion of the polymer layer to at least a portion of the micro-electromechanical device.

5. The method of claim 4, wherein said bonding comprises bonding at least a portion of the polymer layer to the electrode of the micro-electromechanical device.

6. A method of forming a packaged micro-electromechanical device, comprising:
    forming a first substrate having a micro-electromechanical device therein adjacent a first surface thereof;
    bonding a first surface of a second substrate to the first surface of the first substrate; then
    selectively etching the second surface of the second substrate for a sufficient duration to define a through-substrate opening therein that exposes a portion of the micro-electromechanical device;
    depositing an electrically conductive metal layer on the second surface of the second substrate and on the first surface of the first substrate and into the through-substrate opening; and
    patterning the electrically conductive metal layer to define a seal ring that hermetically seals the first and second substrates together and concurrently define a through-substrate via that contacts the exposed portion of the micro-electromechanical device.

7. The method of claim 6, wherein said depositing is preceded by a step of thinning the second substrate.

* * * * *